US008914704B2

(12) United States Patent
Das et al.

(10) Patent No.: US 8,914,704 B2
(45) Date of Patent: Dec. 16, 2014

(54) MECHANISM FOR ACHIEVING HIGH MEMORY RELIABLITY, AVAILABILITY AND SERVICEABILITY

(75) Inventors: Debaleena Das, Los Gatos, CA (US); Kai Cheng, Portland, CA (US); Jonathan C. Jasper, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 13/538,922

(22) Filed: Jun. 29, 2012

(65) Prior Publication Data
US 2014/0006899 A1    Jan. 2, 2014

(51) Int. Cl.
H03M 13/05    (2006.01)
G06F 11/10    (2006.01)

(52) U.S. Cl.
USPC .................. 714/763; 714/E11.034; 714/712; 714/820

(58) Field of Classification Search
CPC ............ G06F 11/1076; G06F 11/1008; G06F 11/1068; G06F 11/1044; H05K 999/99
USPC ................... 714/763, 764, 712, 820, E11.034
See application file for complete search history.

(56) References Cited

U.S. PATENT DOCUMENTS

| 8,458,515 B1* | 6/2013 | Saeed ........................... 714/6.22 |
| 2005/0193312 A1* | 9/2005 | Smith et al. ................... 714/755 |
| 2006/0069965 A1* | 3/2006 | Ito ................................. 714/100 |
| 2009/0241008 A1* | 9/2009 | Kim et al. ...................... 714/755 |
| 2013/0024735 A1* | 1/2013 | Chung et al. .................. 714/704 |

* cited by examiner

Primary Examiner — Sam Rizk
Assistant Examiner — Kyle Vallecillo
(74) Attorney, Agent, or Firm — Blakely, Sokoloff, Taylor & Zafman LLP

(57) ABSTRACT

A mechanism is described for achieving high memory reliability, availability, and serviceability (RAS) according to one embodiment of the invention. A method of embodiments of the invention includes detecting a permanent failure of a first memory device of a plurality of memory devices of a first channel of a memory system at a computing system, and eliminating the first failure by merging a first error-correction code (ECC) locator device of the first channel with a second ECC locator device of a second channel, wherein merging is performed at the second channel.

14 Claims, 4 Drawing Sheets

MECHANISM FOR ACHIEVING HIGH MEMORY RELIABLITY, AVAILABILITY AND SERVICEABILITY

FIELD

Embodiments of the invention relate to memory systems. More particularly, embodiments of the invention relate to a mechanism for achieving high memory reliability, availability, and serviceability (RAS).

BACKGROUND

Computer systems, utilize memory devices that are known to be far less reliable than would be desirable. Various reliability features have been developed, particularly in high-end computer servers, to address such concerns and are generally referred to as RAS features, such as rank sparing and double device data correction (DDDC). However, these conventional features or schemes for achieving high RAS are not regarded as resource-efficient as they typically require lockstepping and result in significant performance inefficiencies, power penalties, and capacity costs. For example, rank sparing requires that an entire rank of memory be held in reserve to cover for a failed device in the future, while DDDC typically requires lockstepping, resulting in high power consumption and reduced bandwidth.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in details in order not to obscure the understanding of this description.

In embodiment, a mechanism for achieving high RAS is described here. The mechanism, in one embodiment, includes a novel technique for merging of error-correction code (ECC) to implement, for example, a x4 Double Device Data Correction (DDDC) and x8 Single Device Data Correction (SDDC) without having to employ lockstepping or incurring capacity cost. It is contemplated that this mechanism is not limited to x4 DDDC or x8 SDDC and can be implemented across ranks, dual in-line memory modules (DIMMs), channels, etc. However, for brevity, clarity and ease of understanding, this document focuses on x4 DDDC but is not limited to it.

Figure 1:
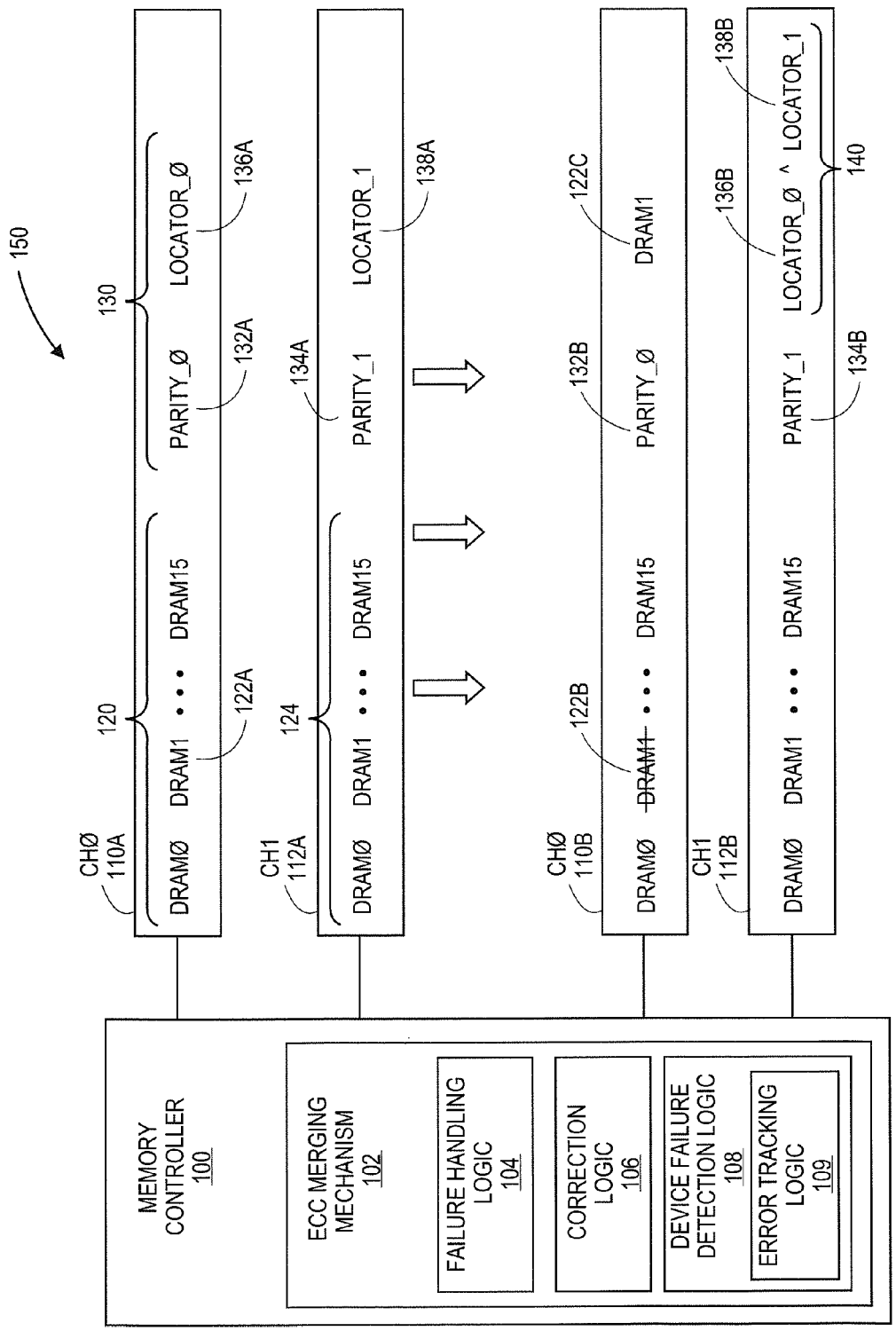
FIG. 1 illustrates an embodiment of an error-correction code (ECC) merging mechanism in a memory system.

FIG. 1 illustrates an embodiment of an ECC merging mechanism 102 in a memory system 150. The illustrated embodiment focuses on a x4 DDDC but, as aforementioned, embodiments of the present invention are not limited to it. In one embodiment, memory controller 100 is shown to employ ECC merging mechanism 102 having failure handling logic 104, correction logic 106, device failure detection logic 108. In one embodiment, device failure detection logic 108 detects the hard or permanent failure of one or more memory devices 120, 124. In one embodiment, failure handling logic 104 facilitates elimination of a failed memory device 120, 124. Correction logic 106 facilitates ECC correction of any error (hard failure or soft error). It is contemplated that memory controller 100 may be employed at a processor or a memory, such as at processor 310 and/or memory 320, respectively, of FIG. 3.

In one embodiment, memory channel 0 110A and memory channel 1 112A are provided as having memory devices 120 and memory devices 124, respectively. Memory devices 120 may include dynamic random access memory (DRAM) 0, DRAM 1, DRAM 2 thru DRAM 15 and, similarly, memory devices 124 may include DRAM 0, DRAM 1, DRAM 2 thru DRAM 15. Further, channel 0 110A may include two ECC devices, such as parity_0 132A and locator_0 136A and, similarly, channel 1 112A may also include two ECC devices, such as parity_1 134A and locator_1 138A. During normal operation, the two ECC devices 132A, 134A, 136A, 138A (e.g., 8 ECC bytes) in a cache line may be used to implement or provide an SDDC at full bandwidth and thus, no performance or power costs are incurred. Upon detection of failure of any one or more of memory devices 120, 124, ECC merging mechanism 102 provides correction techniques that offer a far less expensive solution as compared to traditional lockstepping solutions that are currently in use.

A memory device, DRAM 1 122A, represents a failed or failing device and is illustrated as DRAM 1 122B. Device failure detection logic 108 is compatible with any number and type of mechanisms that can be used to detect device failures and further, the presence of a failed memory device may be communicated to device failure detection logic 108 in any manner known in the art. In one embodiment, device failure detection logic 108 includes error tracking logic 109 to track errors associated with each memory device 120, 124 to pre-determine or predict failure of a particular memory device based on the number of errors tracked to be associated with that memory device. For example and in one embodiment, error tracking logic 109 may track such errors using a combination of parity 132A, 134A (to detect errors) and location 136A, 138A (to provide locations of the detected errors so they may be corrected). This technique of tracking can be used to identify hard failures (as opposed to soft errors) and then eliminate the failed device, such as DRAM 1 122B, from the memory sub-system 120.

In response to the failed or failing DRAM 1 122B, memory is organized. In one embodiment, as driven by failure handling 104, data from the failed DRAM 1 122B is copied to one of the ECC devices 130 previously used to store ECC data, such as locator_0 136A. In other words, DRAM 1 122B replaces locator_0 136A and is shown as DRAM 1 122C. Further, in one embodiment, a buddy line 140 is generated to provide an ECC device merger, such as having device locator_0 136A from channel 0 110A be merged with device locator_1 138A of channel 1 112A, now shown as a merged device locator_0 ^ locator_1 136B, 138B in the buddy line 140 of channel 1 112B. The ECC correction logic 106 may now correct errors from a second failed device (not shown) of memory devices 120, 124. The symbol "^" represents XOR, XORing or XOR logic.

If there are no errors detected, as indicated by parity_0 132A, 132B and parity_1 134A, 134B, the process continues with normalcy; while, if one or more errors are detected, the locator is extracted for correction of the failure or data ready. For example, if the failed device, such as DRAM 15, is detected in channel 0 110B and no errors are found in channel 1 112B, the locator extraction refers to a required locator, where required locator=merged locator (in DRAM) ^ locator (computed from data) of buddy line 140. In this case, locator_0 136B=merged locator in DRAM ^ locator_1 138E computed from data in channel 1 112B. Note that locator computed from data read=locator in DRAM, if there are no errors. It is to be noted, in one embodiment, that these extra processes are needed only in case of a second device failure and errors as indicated by parity_0 132B and parity_1 134B located within each channel 110B, 112B. Therefore, reads may proceed at full bandwidth even after the first device failure of DRAM 1 122B, while writes may be based on read modify writes (RMWs).

Regarding x8 SDDCs, ECC merging mechanism 102 may be applied along the same lines as described above with reference to x4 DDDCs, such as by merging (e.g., XORing) both the parity and location portions of the ECC, wherein two x4 SDDC ECCs can be fitted on a x8 ECC DIMM. A x8 device can be considered as two x4 devices, where each device is fed into one of the x4 ECCs. An exemplary layout of a x8 SDDC may include channel 0 having DRAM 0, DRAM 1, DRAM 2 thru DRAM 7 and a locator device for channels 0 and 1, and channel 1 having DRAM 0, DRAM 1, DRAM 2 thru DRAM 7 and a parity for channels 0 and 1.

It is contemplated that the illustrated memory system 150 including the number of memory channels 110A, 110B, 112A, 112B, memory devices 120, 124, ECC devices 130, etc., shown here are for illustrative purposes and not to limit, in anyway, the embodiments of the present invention. For example, an embodiment, may have a different number and types of memory channels, memory modules, memory devices, ECC devices, or the like, as well as varying topologies, memory structures, components, architectural features, etc.

It is contemplated that any number and type of components may be added to and/or removed from the ECC merging mechanism 102 to facilitate various embodiments of the invention. For brevity, clarity, and ease of understanding of the ECC merging mechanism 110, many of the standard and/or known components, such as those of a computing device, are not shown or discussed here. It is contemplated that embodiments of the invention are not limited to any particular technology, topology, system, architecture, and/or standards and are dynamic enough to adopt and adapt to changes.

Figure 2A:
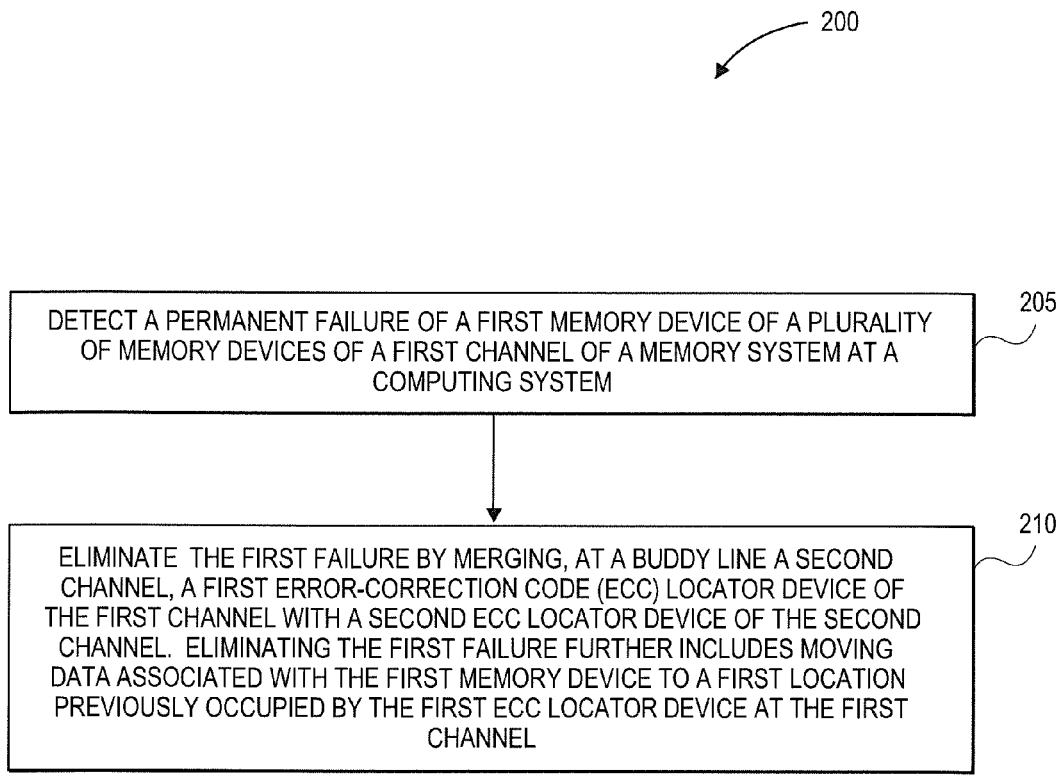
FIG. 2A illustrates a method for ECC merging according to one embodiment.

FIG. 2A a method for ECC merging according to one embodiment. Method 200 may be performed by processing logic that may comprise hardware (e.g., circuitry, dedicated logic, programmable logic, etc.), software (such as instructions run on a processing device), or a combination thereof. In one embodiment, method 220 may be performed by the ECC merging mechanism 102 of FIG. 1.

At block 205, a first hard or permanent failure of a memory device is detected. The failed memory device may be part of a number of memory devices of a first channel at a computing system. It is contemplated that the first or any other device failure is not limited to the first channel and that the first channel is mentioned as an example for brevity, consistency, and ease of understanding. At block 210, in one embodiment, the first failure is handled or eliminated by merging a first ECC locator device of the first channel with a second ECC locator device of a second channel. This merging is performed at the second channel. Further, in one embodiment, the elimination of the first failure may further include moving any data associated with the first memory device to a first location previously occupied by the first ECC locator device at the first channel. In one embodiment, the merging of the first and second ECC locator devices is performed at a buddy line of the first channel, where the buddy line represents an extension of a second location occupied by the second ECC locator of the second channel.

Further, a second hard or permanent failure of a second memory device of the memory devices of the first channel of the memory system may be detected. In one response, in one embodiment, an extract locator may be calculated based on information associated with the first and second ECC locators and the second device failure is eliminated based on locator extraction data associated with the extract locator. The calculated extract locator may represent a required locator. In one embodiment, a correction plan may be prepared for correction of the second failure and the correction of the second failure may be performed based on the prepared correction plan. As aforementioned with respect to the first failure, it is contemplated that the second or any subsequent device failure is not limited to the first channel and that the first channel is mentioned as an example for brevity, consistency, and ease of understanding.

Figure 2B:
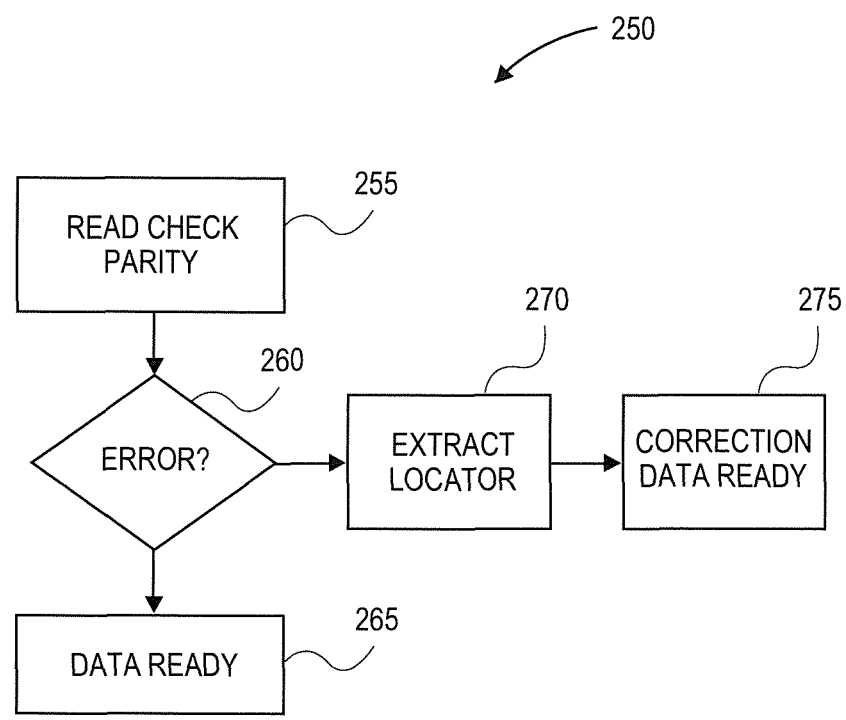
FIG. 2B illustrates a method for generating location extraction according to one embodiment.

FIG. 2B illustrates a method for generating location extraction according to one embodiment of the invention. Method 250 may be performed by processing logic that may comprise hardware (e.g., circuitry, dedicated logic, programmable logic, etc.), software (such as instructions run on a processing device), or a combination thereof. In one embodiment, method 250 may be performed by the ECC merging mechanism 102 of FIG. 1.

Method 250 starts with block 255, with parity checked to determine whether any errors have been detected at block 260. If no such errors have been detected, at block 265, data is regarded as ready and the process continues with normalcy. If one or more errors have been detected, an extract locator (or location extraction) is calculated, at block 270, as described with reference to FIG. 1 which leads to correction data ready at block 275, where the location extraction is then used to correct any failure relating to a second/subsequent memory device. For example, in one embodiment, the location extraction may provide the required locator that equals merged locator ^ location of buddy line. For example, if the second/subsequent device failure is detected in channel 0, the required locator may equal merged locator in DRAM ^ locator computed from data of buddy line, where locator_0 may equal merged locator in DRAM ^ locator_1 as computed from data in channel 1. Further, locator computed from data read may equal locator in DRAM, if there are no errors. In one embodiment, the processes relating to calculation of locator extraction may be needed and used only in case of a second/subsequent device failure and based on any errors as detected and indicated by the parity located within each channel line. Further, although "reads" may proceed at full bandwidth even after the first device failure, any "writes" may need RMWs to proceed.

Figure 3:
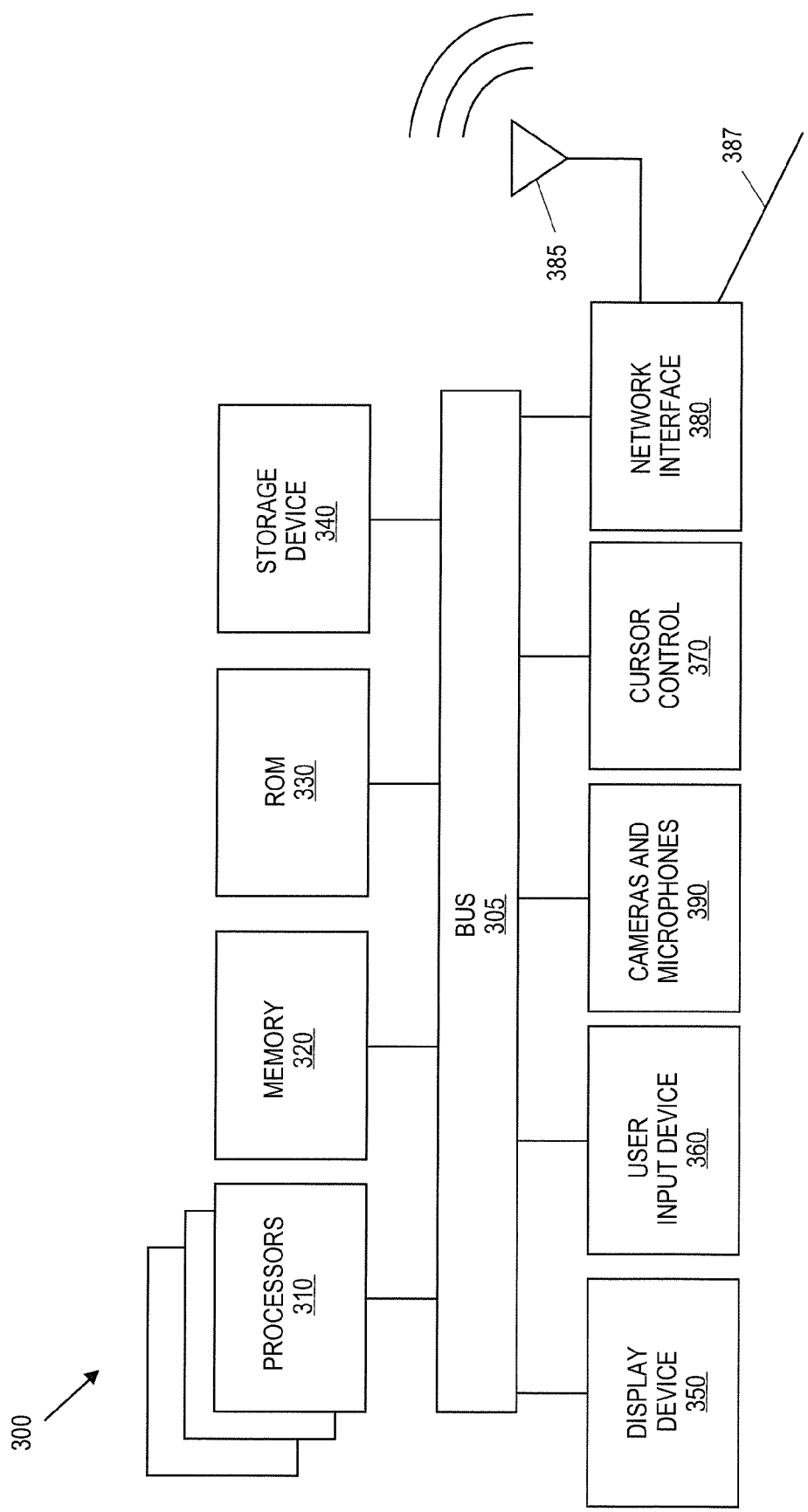
FIG. 3 illustrates a computer system suitable for implementing embodiments of the present disclosure according to one embodiment.

FIG. 3 illustrates an embodiment of a computing system 300. Computing system 300 represents a range of computing and electronic devices (wired or wireless) including, for example, desktop computing systems, laptop computing systems, cellular telephones, personal digital assistants (PDAs) including cellular-enabled PDAs, set top boxes, smartphones, tablets, etc. Alternate computing systems may include more, fewer and/or different components.

Computing system 300 includes bus 305 (or a link, an interconnect, or other communication device to communicate information) and processor 310 coupled to bus 305 that may process information. While computing system 300 is illustrated with a single processor, electronic system 300 and may include multiple processors and/or co-processors, such as one or more of central processors, graphics processors, and physics processors, etc. Computing system 300 may further include random access memory (RAM) or other dynamic storage device 320 (referred to as main memory), coupled to bus 305 and may store information and instructions that may be executed by processor 310. Main memory 320 may also be used to store temporary variables or other intermediate information during execution of instructions by processor 310.

Computing system 300 may also include read only memory (ROM) and/or other storage device 330 coupled to bus 305 that may store static information and instructions for processor 310. Date storage device 340 may be coupled to bus 305 to store information and instructions. Date storage device 240, such as magnetic disk or optical disc and corresponding drive may be coupled to computing system 300.

Computing system 300 may also be coupled via bus 305 to display device 350, such as a cathode ray tube (CRT), liquid crystal display (LCD) or Organic Light Emitting Diode (OLED) array, to display information to a user. User input device 360, including alphanumeric and other keys, may be coupled to bus 305 to communicate information and command selections to processor 310. Another type of user input 360 device is cursor control 270, such as a mouse, a trackball, or cursor direction keys to communicate direction information and command selections to processor 310 and to control cursor movement on display 350.

Camera and microphone arrays 390 of computer system 300 may be coupled to bus 305 to observe gestures, record audio and video and to receive and transmit visual and audio commands.

Computing system 300 may further include network interface(s) 380 to provide access to a network, such as a local area network (LAN), wide area network (WAN), metropolitan area network (MAN), personal area network (PAN), an intranet, the Internet, etc. Network interface(s) 380 may include, for example, a wireless network interface having antenna 385, which may represent one or more antenna(e). Network interface(s) 380 may also include, for example, a wired network interface to communicate with remote devices via network cable 387, which may be, for example, an Ethernet cable, a coaxial cable, a fiber optic cable, a serial cable, or a parallel cable.

Network interface(s) 380 may provide access to a LAN, for example, by conforming to IEEE 802.11b and/or IEEE 802.11g standards, and/or the wireless network interface may provide access to a personal area network, for example, by conforming to Bluetooth standards. Other wireless network interfaces and/or protocols, including previous and subsequent versions of the standards, may also be supported.

In addition to, or instead of, communication via the wireless LAN standards, network interface(s) 380 may provide wireless communication using, for example, Time Division, Multiple Access (TDMA) protocols, Global Systems for Mobile Communications (GSM) protocols, Code Division, Multiple Access (CDMA) protocols, and/or any other type of wireless communications protocols.

Network interface(s) 380 may including one or more communication interfaces, such as a modem, a network interface card, or other well-known interface devices, such as those used for coupling to the Ethernet, token ring, or other types of physical wired or wireless attachments for purposes of providing a communication link to support a LAN or a WAN, for example. In this manner, the computer system may also be coupled to a number of peripheral devices, clients, control surfaces, consoles, or servers via a conventional network infrastructure, including an Intranet or the Internet, for example.

It is to be appreciated that a lesser or more equipped system than the example described above may be preferred for certain implementations. Therefore, the configuration of computing system 300 may vary from implementation to implementation depending upon numerous factors, such as price constraints, performance requirements, technological improvements, or other circumstances. Examples of the electronic device or computer system 300 may include without limitation a mobile device, a personal digital assistant, a mobile computing device, a smartphone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combinations thereof.

Embodiments may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

Embodiments may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection). Accordingly, as used herein, a machine-readable medium may, but is not required to, comprise such a carrier wave.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments. Specifics in the examples may be used anywhere in one or more embodiments. The various features of the different embodiments may be variously combined with some features included and others excluded to suit a variety of different applications. Some embodiments pertain to a method comprising: detecting a permanent failure of a first memory device of a plurality of memory devices of a first channel of a memory system at a computing system; and eliminating the first failure by merging a first error-correction code (ECC) locator device of the first channel with a second ECC locator device of a second channel, wherein merging is performed at the second channel.

Embodiments include any of the above methods wherein eliminating further comprises moving data associated with the first memory device to a first location previously occupied by the first ECC locator device at the first channel.

Embodiments include any of the above methods wherein merging of the first and second ECC locator devices is performed at a buddy line of the second channel, wherein the buddy line represents an extension of a second location occupied by the second ECC locator of the second channel.

Embodiments include any of the above methods further comprising detecting a second failure of a second memory device of a plurality of memory devices of the first channel of the memory system.

Embodiments include any of the above methods further comprising calculating extract locator based on information associated with the first and second ECC locators, wherein the extract locator represents a required locator.

Embodiments include any of the above methods further comprising eliminating the second failure based on locator extraction data associated with the extract locator.

Embodiments include any of the above methods further comprising preparing a correction plan for elimination of the second failure, wherein eliminating is performed based on the prepared correction plan.

Some embodiments pertain to a memory controller comprising: an error-correction code (ECC) merging mechanism having first logic to detect a permanent failure of a first memory device of a plurality of memory devices of a first channel of a memory system at a computing system; and second logic to eliminate the first failure by merging a first error-correction code (ECC) locator device of the first channel with a second ECC locator device of a second channel, wherein merging is performed at the second channel.

Embodiments include the memory controller above wherein the second logic is further to move data associated with the first memory device to a first location previously occupied by the first ECC locator device at the first channel.

Embodiments include the memory controller above wherein merging of the first and second ECC locator devices is performed at a buddy line of the second channel, wherein the buddy line represents an extension of a second location occupied by the second ECC locator of the second channel.

Embodiments include the memory controller above wherein the first logic is further to detect a second failure of a second memory device of a plurality of memory devices of the first channel of the memory system.

Embodiments include the memory controller above wherein the second logic is further to calculate extract locator based on information associated with the first and second ECC locators, wherein the extract locator represents a required locator.

Embodiments include the memory controller above wherein the second logic is further to eliminate the second failure based on locator extraction data associated with the extract locator.

Embodiments include the memory controller above wherein the ECC merging mechanism further comprises third logic to prepare a correction plan for elimination of the second failure, wherein elimination is performed based on the prepared correction plan.

Some embodiments pertain to a system comprising: one or more memory devices; and an error-correction code (ECC) merging mechanism to detect a permanent failure of a first memory device of a plurality of memory devices of a first channel of a memory system at a computing system, and eliminate the first failure by merging a first error-correction code (ECC) locator device of the first channel with a second ECC locator device of a second channel, wherein merging is performed at the second channel.

Embodiments include the system above wherein the ECC merging mechanism is further to move data associated with the first memory device to a first location previously occupied by the first ECC locator device at the first channel.

Embodiments include the system above wherein merging of the first and second ECC locator devices is performed at a buddy line of the second channel, wherein the buddy line represents an extension of a second location occupied by the second ECC locator of the second channel.

Other embodiments pertain to an apparatus comprising means for performing any one or more of the operations mentioned above.

Other embodiments pertain to at least one machine-readable comprising a plurality of instructions that in response to being executed on a computing device, causes the computing device to carry out a method according to any one or more of the operations mentioned above.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A method comprising:
tracking errors associated with a plurality of memory devices;
predictively detecting, based on the tracked errors, a first failure of a first memory device of a plurality of memory devices of a first channel of a memory system at a computing system; and
eliminating the first failure by merging a first error control device of the first channel with a second error control device of a second channel, wherein the merging of the first and second error control devices forms a first buddy line at the second channel, wherein the first buddy line represents an extension of a locator line providing a first locator associated with a first error control device merged with a second locator associated with a second error control device, wherein the first buddy line is further extended into a second buddy line by merging a third locator with the first and second locators if a second failure of the first memory device or a second memory device is predictively detected, wherein each of the first and second error control devices comprises an error-correction code (ECC) device having at least one of a parity and a locator.

2. The method of claim 1, wherein eliminating further comprises moving data associated with the first memory device to the first locator at the first buddy line, the first locator being previously occupied by the first error control device at the first channel.

3. The method of claim 1, further comprising calculating location extraction data associated with an extract locator based on information associated with the first and second locators of the first and second error control devices, respectively, wherein the extract locator represents a required locator, wherein the second failure is eliminated based on the location extraction data associated with the extract locator.

4. The method of claim 1, further comprising preparing a correction plan for elimination of the second failure, wherein eliminating is performed based on the prepared correction plan.

5. An apparatus comprising:
first logic to track errors associated with a plurality of memory devices, and predictively detect, based on the tracked errors, a first failure of a first memory device of a plurality of memory devices of a first channel of a memory system at a computing system; and
second logic to eliminate the first failure by merging a first error control device of the first channel with a second error control device of a second channel, wherein the merging of the first and second error control devices forms a first buddy line at the second channel, wherein the first buddy line represents an extension of a locator line providing a first locator associated with a first error control device merged with a second locator associated with a second error control device, wherein the first buddy line is further extended into a second buddy line by merging a third locator with the first and second locators if a second failure of the first memory device or a second memory device is predictively detected, wherein each of the first and second error control devices comprises an error-correction code (ECC) device having at least one of a parity and a locator.

6. The apparatus of claim 5, wherein the second logic is further to move data associated with the first memory device to the first locator at the first buddy line, the first locator being previously occupied by the first error control device at the first channel.

7. The apparatus of claim 5, wherein the second logic is further to calculate location extraction data associated with an extract locator based on information associated with the first and second locators of the first and second error control devices, respectively, wherein the extract locator represents a required locator, wherein the second failure is eliminated based on the location extraction data associated with the extract locator.

8. The memory controller of claim 5, wherein the ECC merging mechanism further comprises third logic to prepare a correction plan for elimination of the second failure, wherein elimination is performed based on the prepared correction plan.

9. The method of claim 1, wherein the location extraction data is calculated based on errors as detected and calculated by a first parity associated with the first error control device or a second parity associated with the second error control device, wherein one or more reads are processed at full bandwidth and wherein one or more writes are processed based on read modify writes (RMWs).

10. The memory controller of claim 5, wherein the location extraction data is calculated based on errors as detected and calculated by a first parity associated with the first error control device or a second parity associated with the second error control device, wherein one or more reads are processed at full bandwidth and wherein one or more writes are processed based on read modify writes (RMWs).

11. At least one non-transitory machine-readable medium having stored thereon instructions which when executed by a processing device, cause the processing device to perform one or more operations comprising:
tracking errors associated with a plurality of memory devices;
predictively detecting, based on the tracked errors, a first failure of a first memory device of a plurality of memory devices of a first channel of a memory system at a computing system; and
eliminating the first failure by merging a first error control device of the first channel with a second error control device of a second channel, wherein the merging of the first and second error control devices forms a first buddy line at the second channel, wherein the first buddy line represents an extension of a locator line providing a first locator associated with a first error control device merged with a second locator associated with a second error control device, wherein the first buddy line is further extended into a second buddy line by merging a third locator with the first and second locators if a second failure of the first memory device or a second memory device is predictively detected, wherein each of the first and second error control devices comprises an error-correction code (ECC) device having at least one of a parity and a locator.

12. The non-transitory machine-readable medium of claim 11, wherein eliminating further comprises moving data associated with the first memory device to the first locator at the first buddy line, the first locator being previously occupied by the first error control device at the first channel.

13. The non-transitory machine-readable medium of claim 11, wherein the one or more operations further comprise calculating location extraction data associated with an extract locator based on information associated with the first and second locators of the first and second error control devices, respectively, wherein the extract locator represents a required locator, wherein the second failure is eliminated based on the location extraction data associated with the extract locator.

14. The non-transitory machine-readable medium of claim 11, wherein the one or more operations further comprise preparing a correction plan for elimination of the second failure, wherein eliminating is performed based on the prepared correction plan.

* * * * *